(12) United States Patent
Kirsch et al.

(10) Patent No.: US 7,898,857 B2
(45) Date of Patent: Mar. 1, 2011

(54) MEMORY STRUCTURE HAVING VOLATILE AND NON-VOLATILE MEMORY PORTIONS

(75) Inventors: Howard C. Kirsch, Eagle, ID (US);
Charles Ingalls, Meridian, ID (US);
Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 369 days.

(21) Appl. No.: 12/052,300

(22) Filed: Mar. 20, 2008

(65) Prior Publication Data

US 2009/0237996 A1 Sep. 24, 2009

(51) Int. Cl.
*G11C 16/04* (2006.01)

(52) U.S. Cl. ........... 365/185.05; 365/185.08; 365/185.17

(58) Field of Classification Search ............. 365/185.01, 365/185.05, 185.08, 185.17
See application file for complete search history.

(56) References Cited

U.S. PATENT DOCUMENTS

| | | | |
|---|---|---|---|
| 3,885,861 A | 5/1975 | Farnsworth et al. | |
| 4,964,080 A * | 10/1990 | Tzeng | 365/185.01 |
| 5,160,987 A | 11/1992 | Pricer et al. | |
| 5,196,722 A * | 3/1993 | Bergendahl et al. | 257/304 |
| 5,196,910 A | 3/1993 | Moriuchi et al. | |
| 5,399,516 A * | 3/1995 | Bergendahl et al. | 438/589 |
| 5,661,061 A | 8/1997 | Usuami et al. | |
| 5,821,513 A | 10/1998 | O'Hagan et al. | |
| 5,858,829 A | 1/1999 | Chen | |
| 5,874,760 A * | 2/1999 | Burns et al. | 257/315 |
| 5,925,918 A | 7/1999 | Wu et al. | |
| 5,949,057 A | 9/1999 | Feng | |
| 6,008,513 A | 12/1999 | Chen | |
| 6,009,011 A | 12/1999 | Yamauchi | |
| 6,043,562 A | 3/2000 | Keeth | |
| 6,081,008 A | 6/2000 | Rostoker | |
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |
| 6,258,659 B1 | 7/2001 | Gruening et al. | |
| 6,268,243 B1 | 7/2001 | Park | |

(Continued)

FOREIGN PATENT DOCUMENTS

DE 19946719 4/2001

(Continued)

OTHER PUBLICATIONS

U.S. Appl. No. 12/033,768, filed Feb.19, 2008, Juengling.

(Continued)

*Primary Examiner* — Viet Q Nguyen
(74) *Attorney, Agent, or Firm* — Fletcher Yoder

(57) ABSTRACT

A memory array is provided that includes a transistor having two active gates sharing a source, a drain, and a channel of the transistor. One of the active gates may be coupled to a volatile memory portion of a memory cell, such as a DRAM cell, and the other active gate may be coupled to a non-volatile memory portion, for example, a charge storage node such as a SONOS cell. Methods of operating the memory array are provided that include transferring data from the volatile memory portions to the non-volatile memory portions, transferring data from the non-volatile memory portions to the volatile memory portions, and erasing the non-volatile memory portions of a row of memory cells.

24 Claims, 7 Drawing Sheets

U.S. PATENT DOCUMENTS

| | | | |
|---|---|---|---|
| 6,282,113 B1 | 8/2001 | DeBrosse | |
| 6,316,309 B1 | 11/2001 | Holmes et al. | |
| 6,380,759 B1 | 4/2002 | Agrawal et al. | |
| 6,432,769 B1 | 8/2002 | Fukuda et al. | |
| 6,440,792 B1 | 8/2002 | Shaio et al. | |
| 6,689,660 B1 | 2/2004 | Noble et al. | |
| 6,845,033 B2 | 1/2005 | Kirihata et al. | |
| 6,897,107 B2 | 5/2005 | Divakaruni et al. | |
| 6,903,967 B2* | 6/2005 | Mathew et al. | 365/177 |
| 6,927,462 B2 | 8/2005 | Goodwin et al. | |
| 6,967,147 B1 | 11/2005 | Tews et al. | |
| 6,998,666 B2 | 2/2006 | Beintner et al. | |
| 7,016,227 B2* | 3/2006 | Inoue | 365/185.08 |
| 7,091,543 B2 | 8/2006 | Tzeng et al. | |
| 7,091,551 B1* | 8/2006 | Anderson et al. | 257/324 |
| 7,098,105 B2 | 8/2006 | Juengling | |
| 7,099,216 B2 | 8/2006 | Luk et al. | |
| 7,132,333 B2 | 11/2006 | Schloesser et al. | |
| 7,151,023 B1 | 12/2006 | Nayfeh et al. | |
| 7,158,410 B2* | 1/2007 | Bhattacharyya et al. | 365/185.08 |
| 7,190,060 B1 | 3/2007 | Chiang | |
| 7,195,995 B2 | 3/2007 | Mouli | |
| 7,205,606 B2 | 4/2007 | Tran | |
| 7,212,432 B2* | 5/2007 | Ferrant et al. | 365/158 |
| 7,274,067 B2* | 9/2007 | Forbes | 257/316 |
| 7,309,634 B2* | 12/2007 | Hong | 438/288 |
| 7,345,937 B2 | 3/2008 | Yoon et al. | |
| 7,411,823 B2* | 8/2008 | Forbes et al. | 365/185.05 |
| 7,457,159 B2* | 11/2008 | Bhattacharyya et al. | 365/185.08 |
| 7,629,640 B2* | 12/2009 | She et al. | 257/324 |
| 2001/0003034 A1 | 6/2001 | Furukawa et al. | |
| 2002/0155656 A1 | 10/2002 | Hayano et al. | |
| 2003/0168676 A1 | 9/2003 | Itabashi et al. | |
| 2003/0198073 A1 | 10/2003 | Keeth | |
| 2004/0027848 A1 | 2/2004 | Wald et al. | |
| 2004/0043592 A1 | 3/2004 | Goodwin et al. | |
| 2004/0062069 A1 | 4/2004 | Keeth | |
| 2004/0125636 A1 | 7/2004 | Kurjanowicz et al. | |
| 2004/0202027 A1 | 10/2004 | Kuzmenka et al. | |
| 2005/0041470 A1 | 2/2005 | Inoue | |
| 2005/0133852 A1 | 6/2005 | Shau | |
| 2005/0151206 A1 | 7/2005 | Schwerin | |
| 2005/0196918 A1 | 9/2005 | von Schwerin | |
| 2005/0245024 A1 | 11/2005 | von Schwerin | |
| 2006/0006446 A1 | 1/2006 | von Schwerin | |
| 2006/0013042 A1 | 1/2006 | Forbes et al. | |
| 2006/0057814 A1 | 3/2006 | Weis | |
| 2006/0073662 A1 | 4/2006 | Jang et al. | |
| 2006/0076602 A1 | 4/2006 | Harter et al. | |
| 2006/0131651 A1 | 6/2006 | Sato et al. | |
| 2006/0244106 A1 | 11/2006 | Morikado | |
| 2006/0246607 A1 | 11/2006 | Fazan et al. | |
| 2006/0270151 A1 | 11/2006 | Lee | |
| 2006/0273415 A1 | 12/2006 | Kim | |
| 2006/0281250 A1 | 12/2006 | Schloesser | |
| 2007/0010058 A1 | 1/2007 | Juengling | |
| 2007/0023805 A1 | 2/2007 | Wells et al. | |
| 2007/0052040 A1 | 3/2007 | Schwerin | |
| 2007/0111455 A1 | 5/2007 | Kim et al. | |
| 2007/0121414 A1 | 5/2007 | Butler | |
| 2007/0134878 A1 | 6/2007 | Brask et al. | |
| 2007/0145450 A1 | 6/2007 | Wang et al. | |
| 2007/0166933 A1 | 7/2007 | Song et al. | |
| 2007/0170522 A1 | 7/2007 | Lee et al. | |
| 2007/0176221 A1 | 8/2007 | Nakamura | |
| 2007/0176222 A1 | 8/2007 | Ikemasu et al. | |
| 2007/0176253 A1 | 8/2007 | Wang et al. | |
| 2007/0190736 A1 | 8/2007 | Liu et al. | |
| 2007/0205438 A1 | 9/2007 | Juengling | |
| 2007/0262375 A1 | 11/2007 | Juengling | |

FOREIGN PATENT DOCUMENTS

| | | |
|---|---|---|
| JP | 6244384 | 9/1994 |
| JP | 2006054431 | 2/2006 |
| KR | 930005234 | 6/1993 |
| KR | 20020018071 | 3/2002 |
| TW | 380316 | 1/2000 |
| TW | 388125 | 4/2000 |
| WO | WO 9728532 | 8/1997 |
| WO | WO 0161738 | 8/2001 |
| WO | WO 0231878 | 4/2002 |
| WO | WO 0249100 | 6/2002 |
| WO | WO 2004/038770 | 5/2004 |

OTHER PUBLICATIONS

U.S. Appl. No. 12/033,799, filed Feb. 19, 2008, Juengling.
U.S. Appl. No. 12/033,780, filed Mar. 19, 2008, Juengling.
U.S. Appl. No. 12/043,813, filed Mar. 6, 2008, Juengling.
U.S. Appl. No. 12/052,317, filed Mar. 20, 2008, Juengling.
U.S. Appl. No. 12/052,537, filed Mar. 20, 2008, Juengling.
Enrico Gili "Fabrication of Vertical MOSFETs With Reduced Parasitics and Suppression of Short Channel Effects"; Department of Electronics and Compter Science, Microelectronics Group; University of Southampton, Jun. 2004 http://66.102.1.104/scholar?hl=en&lr=&q=cache:BErKI49qg2MJ:www.ecs.soton.ac.uk/~eg02r/Publications/MinithesisEGili.pdf+dram+fins+%22process+flow%22+%22vertical+access%22.
F. Fishburn, et al.; "A 78nm 6F2 DRAM Technology for Multigigabit Densities".
J. Sturm, et al.; "Increased Transconductance in Fully-Depleted Ultra-Thin Silicon-on-Insulator MOSFETs"; 6 pages.
R. Katsumata, et al.; "Fin-Array-FET on bulk silicon for sub-100 nm Trench Capacitor DRAM"; 2003 Symposium on VLSI Technology Digest of Technical Papers; Jun. 2003, pp. 61-62.
T. Park, et al.; "Fabrication of Body-Tied FinFETs (Oega MOSFETs) Using Bulk Si Wafers"; 2003 Symposium on VLSI Technology Digest of Technical Papers; Jun. 2003, 2 pages.
J-H. Ahn, S-H. Hong, S-J. Kim, J-B. Ko, S-W. Shin, S-D. Lee, Y-W. Kim, K-S. Lee, S-K. Lee, S-E. Jang, J-H. Choi, S-Y. Kim, G-H. Baw, S-W. Park, Y-J. Park, "An Experimetnal 256Mb Non-Volatile DRAM with Cell Plate Boosted Programming Technique". IEEE International Solid-State Circuits Conference, ISSCC 2004 / Session 2 / Non-Volatile Memory / 2.2, 2004.
U.S. Appl. No. 12/052,300, filed Mar. 20, 2008, Werner Juengling.
U.S. Appl. No. 12/052,317, filed Mar. 20, 2008, Werner Juengling.
U.S. Appl. No. 12/130,825, filed May 30, 2008, Werner Juengling.
Betty Prince, Ph.D.; "Trends in Scaled and Nanotechnology Memories"; Memory Strategies International; Leander, Texas; 2005.
Branislav Curanovic; "Development of a Fully-Depleted Thin-Body FinFET Process"; Department of Microelectronic Engineering, College of Engineering; Rochester Institute of Technology; Rochester, New York; Nov. 2003.
Claeys, Cor; "Technological Challenges of Advanced CMOS Processing and Their Impact on Design Aspects"; Proceedings of the 17th International Conference on VLSI Design (VLSID '04); 1063-9667/04; IEEE Computer Society; Leuven, Belgium.
Bor-Wen Chan, Min-Hwa Chi, Liou, Y.H; Notch Elimination in Polycide Gate Stack Etching for Advanced DRAM Technology; Center for Technol. Dev., Worldwide Semicond. Manuf. Corp., Hsinchu; http://ieeexplore.ieee.org/xpl/freeabs_all.jsp?tp=&arnumber=883094&isnumber=19090.
Chien Yu, Rich Wise, Anthony Domenicucci; A Two-Step Spacer Etch for High-Aspect-Ration Gate Stack Process; IBM Microelectronics; http://www.mrs.org/s_mrs/s_mrs/sec_subscribe.asp?CID=2353&DID=113693&ation=detail.
Ikeda, H., Inukai, H.; High-Speed DRAM Architecture Development; NEC Corp., Sagamihara; Solid-State Circuits, IEEE Journal; May 1999; vol. 34, Issue 5, pp. 685-692; http://ieeexplore.ieee.org/xpls/abs_all.jsp?arnumber=760380&isnumber=16453.
Endoh, T., Shinmei, K., Sakuraba, H., Masuoka, F.; New Three-Dimensional Memory Array Architecture for Future Ultrahigh-Density DRAM; Res. Inst. Of Electrical Communication, Tohoku University, Sendai; Solid-State Circuites, IEEE Journal; Apr. 1999; vol. 34, Issue 4, pp. 476-483; hottp://ieeexplore.ieee.org/xpls/abs_all.jsp?arnumber=753680.

Takashima, D., Nakano, H.; A Cell Transistor Scalable DRAM Array Architecture; Memory LSI Res. & Dev. Center, Toshiba Corporation, Yokohama; Solid-State Circuits, IEEE Journal; May 2002; vol. 37, Issue 5, pp. 587-591; http://ieeexplore.ieee.org/xpls/abs_all.jsp?arnumber=997851.

Johgn-Man Park, Sang-Yeon Han, Chang-Hoon Jeon, Si-Ok Sohn, Jun-Bum Lee, Yamada, S., Shin-Deuk Kim, Wook-Je Kim; Wouns Yang, Donggun Park, Byung-Il Ryu; Fully Integrated Advanced Bulk FinFETs Architecture Featuring Partially-Insulating Technique for DRAM Cell Application of 40nm Generation and Beyond; http://ieeexplore.ieee.org/xpl/freeabs_all.jsp?arnumber=4154360.

\* cited by examiner

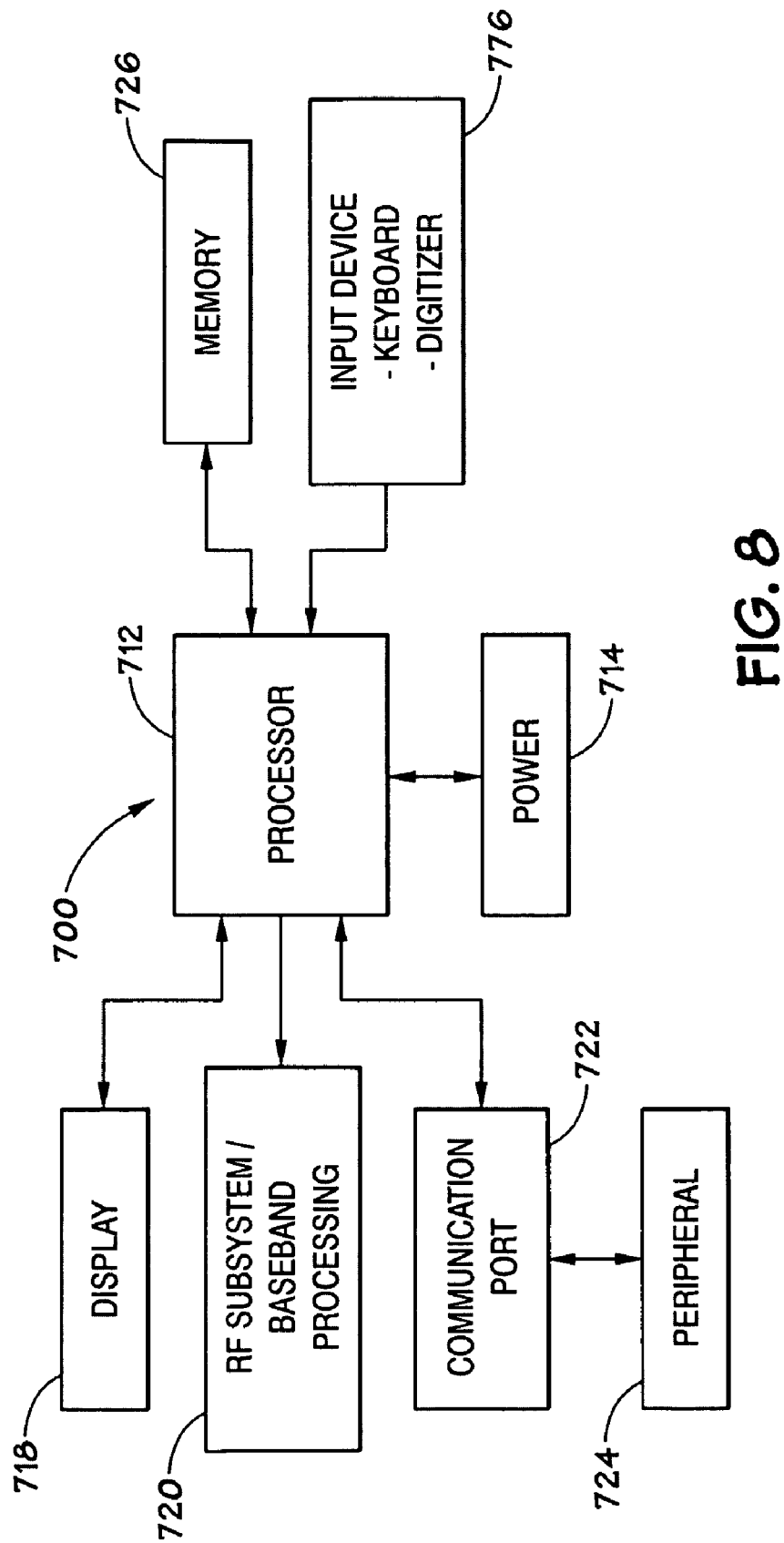

MEMORY STRUCTURE HAVING VOLATILE AND NON-VOLATILE MEMORY PORTIONS

BACKGROUND OF THE INVENTION

1. Field of the Invention

Embodiments of the present invention relates generally to electronic devices, and, more specifically, to non-planar transistors and techniques for operating the same.

2. Description of the Related Art

Fin field effect transistors (finFETs) are often built around a fin (e.g., a tall, thin semiconductive member) extending generally perpendicularly from a substrate. Typically, a gate traverses the fin by conformally running up one side of the fin over the top and down the other side of the fin. Generally, a source and a drain are located on opposite sides of the gate in the fin. In operation, a current through the fin between the source and drain is controlled by selectively energizing the gate.

Typically, such finFETs may be used in construction of a volatile memory cell, such as a dynamic random access memory (DRAM) cell. A volatile memory cell loses the data stored in the cell if power to the memory cell is turned off. In contrast, the contents of a non-volatile memory cell are not erased if power to the cell is turned off. Thus, computers and other electronic devices typically use volatile memory, such as DRAM, in conjunction with non-volatile memory, such as flash memory. As these devices decrease in size, having two different memory devices for both volatile and non-volatile memories may inhibit the size reduction in such devices. Additionally, the speed of the data transfer between the two memory devices may decrease performance of the device.

Embodiments of the present invention may address one or more of the problems set forth above.

BRIEF DESCRIPTION OF THE DRAWINGS

FIG. 8 is a block diagram of a processor-based system in accordance with an embodiment of the present technique.

DETAILED DESCRIPTION OF SPECIFIC EMBODIMENTS

Some of the subsequently discussed embodiments describe a high aspect ratio structure, such as a FinFET, that may include memory cells having volatile and non-volatile portions. As is described in detail below, in some embodiments, data may be transferred between the volatile and non-volatile portions of memory cells of a memory array formed from such structures. The following discussion describes devices and operation of such devices in accordance with embodiments of the present technique. Further, systems in accordance with embodiments of the present technique are described.

Figure 1:
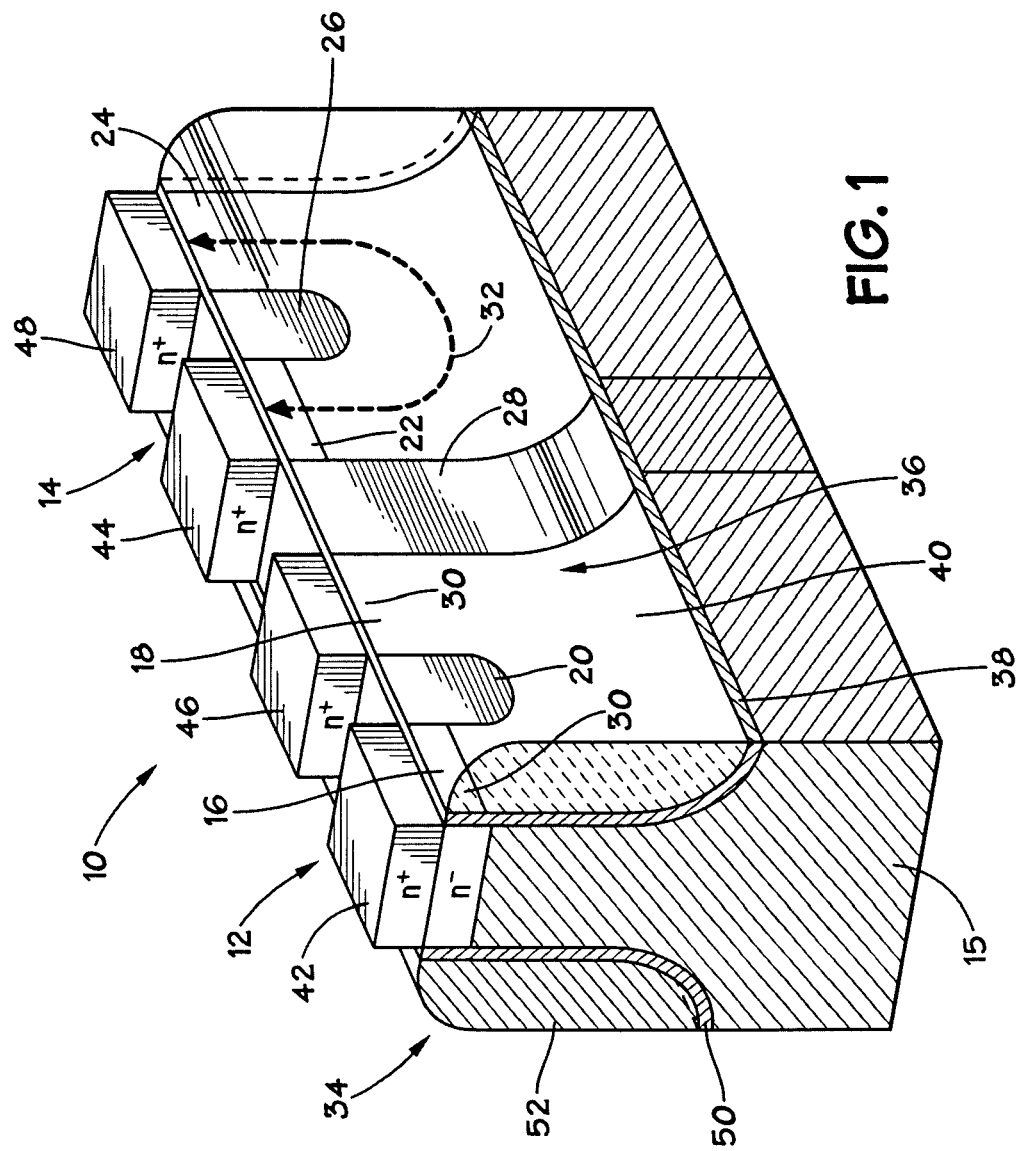
FIG. 1 is a perspective view of a row of a memory array constructed in accordance with an embodiment of the present invention.

FIG. 1 is a perspective view of a high aspect ratio structure, e.g. a FinFET, constructed in accordance with an embodiment of the present invention. In the illustrated embodiment, a row 10 of transistors 12 and 14 in a substrate 15 are illustrated that include memory cells having a volatile memory portion, that behaves as a DRAM cell, and a non-volatile memory portion, that behaves as a Semiconductor-Oxide-Nitride-Oxide-Semiconductor (SONOS) cell. The transistor 12 includes a source 16 and a drain 18 along a horizontal plane. The source 16 and drain 18 are separated by a dielectric 20, such as via a spin-on dielectric. The transistor 14 includes a source 22 and a drain 24 in a horizontal plane, separated by a dielectric 26. In addition, each transistor 12 and 14 are separated by a dielectric 28, such as a spin-on dielectric.

As can be seen in the figure, the dielectrics 20 and 26 separating the source and drain of each memory cell are disposed in relatively "shallow" trenches, as opposed to the dielectric 28, which is disposed in a trench extending further through the substrate. In some embodiments, the shallow trenches may be deeper than the upper doped layer of the substrate 15, to separate subsequently formed sources and drains. Additionally, the deep isolation trenches may be deeper than the shallow trenches to isolate subsequently formed transistors. The deep isolation trenches and/or shallow trenches may have a generally rectangular or trapezoidal cross-section, and, in some embodiments, their cross-section may be generally uniform through a distance larger than one, two, five, or more transistor lengths. The deep isolation trenches and shallow trenches may be partially or entirely filled with various dielectric materials, such as high density plasma (HDP) oxide, for instance, to electrically isolate features. Additionally, the deep isolation trenches and/or shallow trenches may include various liner materials, such as silicon nitride, nanoparticles, or other suitable material, for example, to relieve film stresses, improve adhesion, and/or function as a barrier material.

As mentioned above, to form a transistor, the substrate 15 may be doped to form an upper doped layer 30. The upper doped layers are separated by the shallow trench 20. Thus, to activate the transistor, a source to drain current ($I_{sd}$) is induced, as indicated by line 32. The source-to-drain current threshold may be controlled for each transistor through the formation of the shallow trenches separating the upper doped layer, e.g. trenches 20 and 26. The deeper the shallow trench, for example, the longer the channel length and the lower the ON current. Thus, the depth of the shallow trenches 20 and 26 may differ in various embodiments, depending on the design requirements and desired functionality of the transistors. In this manner the transistors 12 and 14 provide the basis for forming a volatile portion 36 and non-volatile portion 34.

Turning now to the non-volatile and volatile portions 34 and 36 of a memory cell of the row 10, the volatile portion 36, e.g. a DRAM "cell," is constructed by disposing a DRAM gate oxide (GOX) 38 on one side of the transistor row 10. A DRAM control line 40, e.g., wordline, for the volatile portion 36 is then disposed on the DRAM gate oxide 38. A data line 42 (DL0), e.g., bitline, may be coupled to the "top" of the doped region of the substrate, thus contacting the source of the transistor 12. Similarly, another data line 44 (DL1) may be disposed on the source of the transistor 14. A capacitive element is then disposed on the "top" 46 of the separated doped region on the other side of the shallow trench 20 opposite the data line 44. To form the volatile memory portion of the second memory cell in the row 10, another capacitive element may be disposed on the "top" region 48 of the transistor 14. Thus, multiple volatile memory portions, e.g. DRAM "cells," may be formed by utilizing the source and drain in a horizontal plane.

Turning now to the non-volatile portion of the memory cells of row 10, the non-volatile portion 34, e.g. SONOS "cell," is formed similarly to the volatile portion of the memory cells. For example, the non-volatile portion 34 may be formed by disposing various layers onto the finFET. In the embodiment depicted in FIG. 1, the non-volatile portion 34 is formed from a charge trap layer 50 isolated above the substrate. For example, in the non-volatile portion 34, a SONOS cell is formed from a layer of gate oxide, an insulating layer such as silicon nitride ($Si_3N_4$) which in some embodiment may include nanoparticles, and a layer of gate oxide. A gate 52 (which may be a conductive line forming a gate at each transistor) for the non-volatile portion 34 is disposed on the SONOS layer 50. Data may be stored in the non-volatile portion 34 by storing charge (electrons) in the charge storage node (e.g., the silicon nitride layer) of the cell, such as by turning on the transistor and activating the gate 52. For example, if no charge is stored in the silicon nitride layer of the cell, the cell has a low threshold voltage ($V_{th}$(low)); thus, a smaller voltage is needed to induce current flow across the transistor. If charge is stored in the silicon nitride, the cell has a high threshold voltage ($V_{th}$(high)); thus, a larger voltage is needed to induce current flow across the cell. In this manner, the SONOS memory cell may store a "0" or a "1" depending on the state of $V_{th}$. In some embodiments, the gates 40 and 52 may connect together at one end of the row 10. In other embodiments, the gates 40 and 52 may not connect together at the end of the row 10. Further, in some embodiments, the gate oxides 28 and 50 may be identical on both sides of the row 10.

Figure 2:
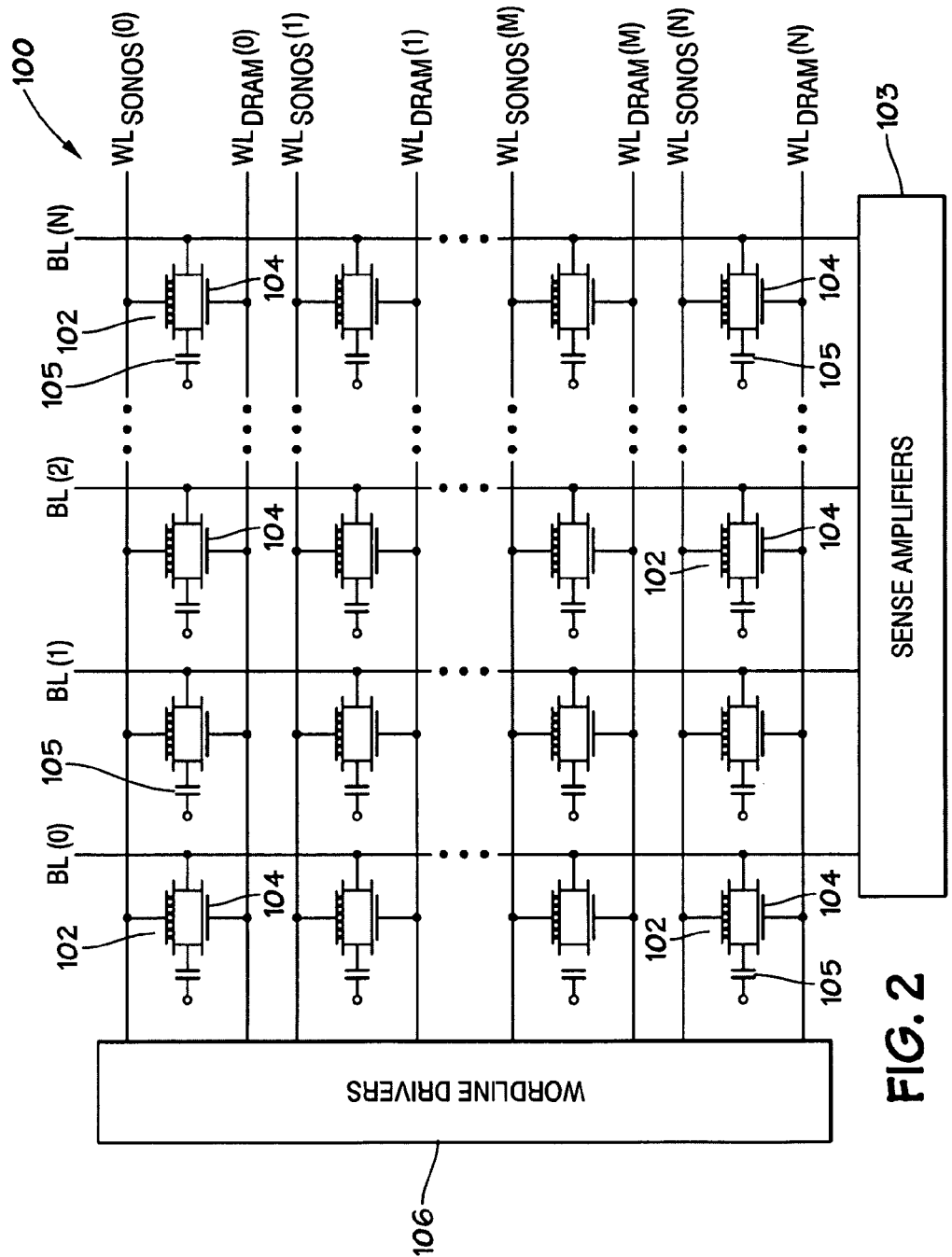
FIG. 2 is a schematic diagram of portion of a memory array having memory cells fabricated in accordance with embodiments of the present invention.

FIG. 2 is a two-dimensional schematic diagram of a portion of a memory array 100 having memory cells that include volatile memory portions 102 and non-volatile memory portions 104 constructed in accordance with an embodiment of the present invention. The memory array includes non-volatile memory wordlines $WL_{SONOS}(0)$-$WL_{SONOS}(N)$, volatile memory wordlines $WL_{DRAM}(0)$-$WL_{DRAM}(M)$, and intersecting local bit lines BL(0)-BL(N).

The memory array 100 includes a memory cell transistor located at each intersection of a wordline WL and a local bit line BL. As described above, the memory cell transistors provide for both the volatile memory portions 104 and non-volatile memory portions 102 of each memory cell for storage of data in the memory array 100. As will be appreciated, each memory cell includes a source, a drain, a charge storage node for the non-volatile memory portion, and a capacitive element 105 for the volatile memory portion. The capacitive element 105 may be coupled to a common plate potential (e.g., $V_{plate}$), which in one embodiment may be held at half the power supply level. Both the volatile and non-volatile portions of a memory cell may be coupled to a data line, and the data lines are connected to a sense module (e.g., one or more sense amplifiers 103). A row of the memory cells include those transistors whose gates are commonly coupled (e.g., to a given control line WL). Thus, to activate the non-volatile portions of a row of memory cells, one or more of the control lines $WL_{SONOS}$ would be activated via a control line driver 106. Similarly, to activate the volatile portions of a row of memory cells, one or more of the control lines $WL_{DRAM}$ would be activated via the control line driver 106.

As will be discussed further below, operation of the memory array may include erasing the volatile or non-volatile memory portions of the memory cells, transferring data from the volatile memory portions to the non-volatile memory portions, and transferring data from the non-volatile memory portions to the volatile memory portions. Data on the datalines may be transferred to the non-volatile portions or volatile portions of a row of memory cells by activating the corresponding wordline via a suitable voltage.

Figure 3:
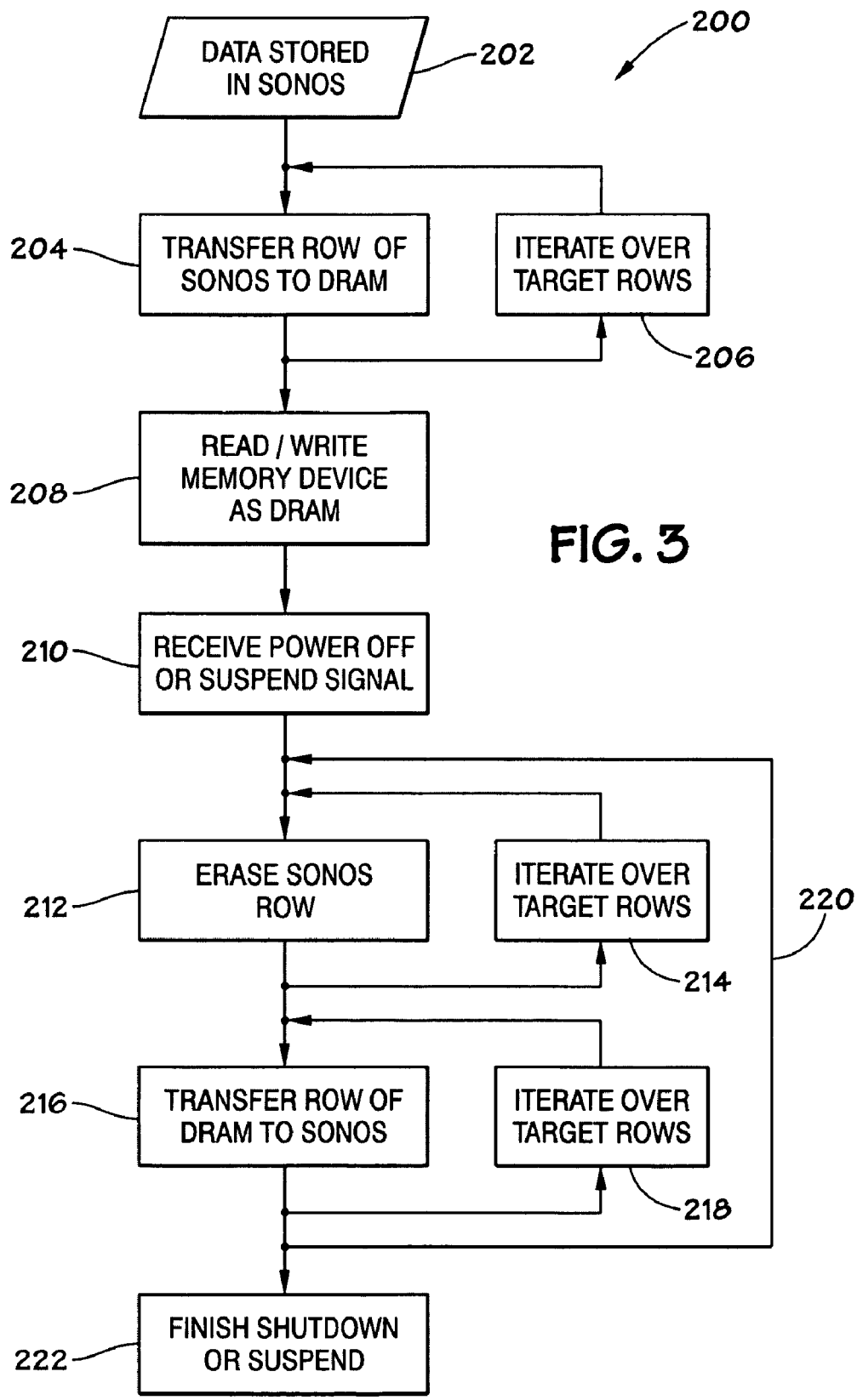
FIG. 3 is a flowchart of a process for operating the memory array of FIGS. 1-2 in accordance with an embodiment of the present invention.

Turning now to operation of the memory array, FIG. 3 depicts a process 200 for operating the memory array of FIGS. 1-2 in accordance with an embodiment of the present invention. The process 200 may be implemented in a computer, any other device, and/or as an on-board operation internal to a device with suitable delay to power off, as described further below in FIG. 8.

The process 200 begins with data stored in the non-volatile memory portions, e.g. the SONOS "cells," of the memory cells of the memory array (block 202). For example, in one embodiment, the electronic device implementing the memory array may be turned off or in a "suspend" mode (also commonly referred to or similar to a "hibernate" mode, "sleep" mode, "stand-by" mode, etc.) and the process 200 may have started after the electronic device has been turned on or awakened from suspension. In other embodiments, however, the process 200 for operating the memory array and managing data in the non-volatile and volatile memory portions may be performed during any other operation of the computer or electronic device, or may be performed in response to software or other hardware configured to specifically utilize the non-volatile and volatile memory portions of the memory array.

Figure 4:
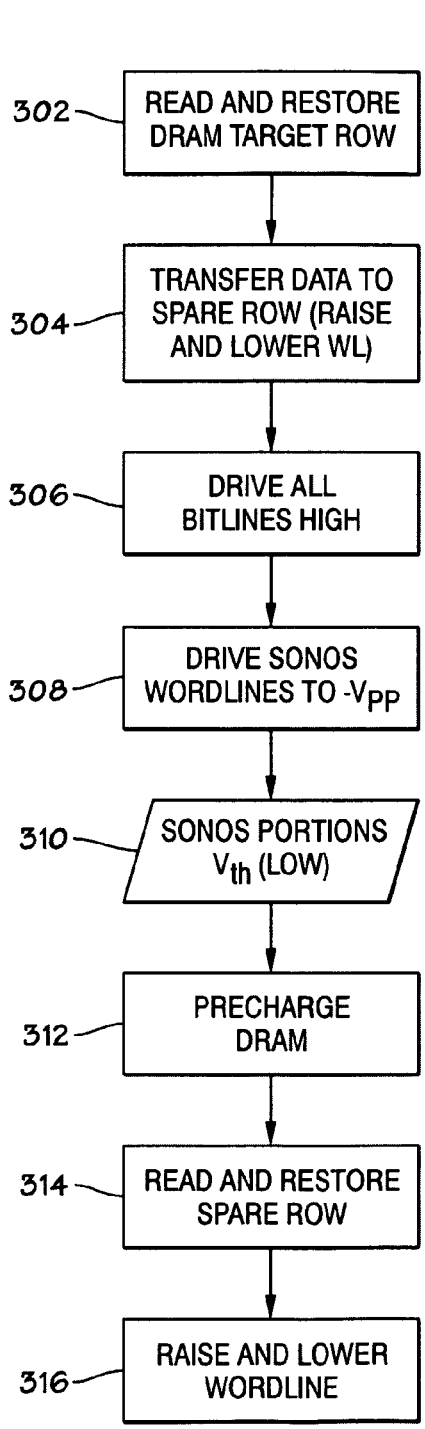
FIG. 4 is a flowchart of an erase operation for the memory array of FIGS. 1-2 in accordance with an embodiment of the present invention.

Initially, the data in the non-volatile memory portions of the memory cells, e.g. SONOS "cells," may be transferred to the volatile memory portions of the memory cells e.g., DRAM "cells," (block 204) as will be discussed further below in FIG. 4. The process of transferring a row of non-volatile memory portions to a row of volatile memory portions may be performed as iterations over the target rows (206), i.e. the volatile memory portions of a row of memory cells. The transfer operation may be performed on multiple banks or sense amplifier sections simultaneously so that transfers may be performed across multiple rows as opposed to a row-by-row operation, as discussed further below in FIGS. 7A and 7B.

Once the data from the non-volatile memory portions has been transferred to the volatile memory portions of the memory cells, the memory array may act as a conventional volatile memory array, such as a DRAM array, allowing conventional read, write, and other DRAM operations. For example, in one embodiment, if the memory is implemented in a computer, the operating system or other software executed on the computer may read and write to the volatile memory portions of the memory array, storing and retrieving program data. Further, the non-volatile portions may continue to store information, as they will not be affected by the lower voltages required to activate the transistors during operation of the volatile memory portions of the memory cells of the memory array.

The process 200 may receive a signal that indicates the electronic device will be shutdown or suspended/hibernated (block 210), and this signal may initiate specific operations, such as a transfer of data from volatile memory portions to non-volatile memory portions. Alternatively, in some embodiments other actions may result in such a transfer operation, such as software or hardware designed to specifically utilize the non-volatile and volatile aspects of the memory array. For instance, in one embodiment, a quick reset to an initial stored state may use the non-volatile and volatile aspects of the memory array.

To preserve data and provide for faster restoration out of suspension as compared to restoring from magnetic memory, such as a hard drive, data stored in volatile memory is typically written to non-volatile memory, thus preserving the data when the power to the computer (and memory array) is turned off. In one embodiment, the non-volatile memory portions of the memory cells of the memory array may provide the non-volatile storage for the data in the volatile memory portions of the memory cells of the memory array. Advantageously, no additional non-volatile memory, such as a hard drive, is needed to provide the data preservation suitable for suspension. Additionally, the memory cell structure described above in FIGS. 1 and 2 may provide for faster data transfers between the volatile memory portions and non-volatile memory portions, as opposed to conventional configurations in which the volatile memory and non-volatile memory are separate memory devices.

As the non-volatile memory portions may contain data from the last write, the rows of the non-volatile memory portions, e.g. the SONOS "cells" of the memory cells, are erased before writing new data (block 212). The target rows to be erased may be erased in multiple banks or sense amplifier sections (214), similar to the transfer operation and as illustrated further below in FIGS. 7A and 7B. Once the non-volatile memory portions are erased, the data in the volatile memory portions may be transferred to the non-volatile memory portions of the memory cells (block 216). For example, a row of volatile memory portions, e.g. the DRAM "cells" of the memory cells, may be transferred to a row of non-volatile memory portions, e.g. SONOS memory "cells" of the memory cells. The transfer operation may be performed on multiple rows or sense amplifier sections (218), similar to the erase and transfer operations discussed above. Additionally, the erase operation and the transfer of data from the volatile memory portions to the non-volatile memory portions may be executed as part of a larger loop (line 220), by erasing and transferring data to each row or group of rows at each iteration. After the erase and transfer operations are complete, the electronic device may finish shutting down or entering suspension (block 222). Because the data that was stored in the volatile memory portions before the shutdown or suspend operation is now stored in the non-volatile memory portions, upon resumption of power and normal operation, a user may be able to resume operation of the electronic device using the data retrieved from the non-volatile memory portions.

Turning now in more detail to the erase operation (block 212) described above, FIG. 4 illustrates an erase operation 300 for erasing a row of non-volatile memory portions, e.g. SONOS "cells" of the memory cell, while keeping the data in the volatile memory portions intact. The operation is performed on the row of memory cells referred to as the "target row." Initially, a standard read and restore operation, e.g. a DRAM read and restore, is performed on the target row (block 302), providing the data from the target row on the corresponding bitlines. The data is then transferred to a "spare row," by raising and lowering the volatile memory wordline of the spare row, thus transferring the data in parallel to the volatile memory portions of the spare row (block 304). Alternatively, in some embodiments the data may be temporarily stored via sense amplifiers with ISO devices, which in one embodiment may be transmission gates inserted between the bitlines and the sense amplifiers. After the data from the volatile memory portions is temporarily stored in the spare row, all bit lines are driven high, i.e., '1' is written to all bitlines (block 306).

To erase the non-volatile memory portions of the memory cells, i.e. remove any charge (electrons) trapped in an insulator (silicon nitride) of the non-volatile memory portions, the non-volatile memory wordline of the target row may be lowered to $-V_{PP}$ (block 308). Alternatively, in some embodiments the bitlines may be disconnected from the sense amplifiers, via ISO devices, and the high bitline level increased from $V_{CC}$ (1.2 V) to $V_{CCP}$ (3.2 V), thereby reducing the required $-V_{PP}$. Thus, the threshold voltage of the non-volatile memory portions is reduced to $V_{th}$(low), as negative charge (electrons) is un-trapped from the non-volatile memory portion (block 310).

Once the non-volatile memory portions are erased, the data in the spare row may be transferred back to the volatile memory portions of the memory cells of the target row, by first precharging the bitlines (block 312). A read and restore is then performed on the spare row (block 314), providing the data onto the bitlines of the memory array. The volatile memory wordline of the target row is then raised and lowered to transfer the data from the bitlines to the volatile memory portions of the memory cells (316). In this manner, the data stored in the volatile memory portions of a row of memory cells is preserved while allowing the necessary voltages required for an erase of a row of non-volatile memory portions. As discussed above, the erase operation may be performed on multiple rows, such that multiple rows or sense amplifier sections may be erased simultaneously, as described for the below in FIGS. 7A and 7B.

Figure 5:
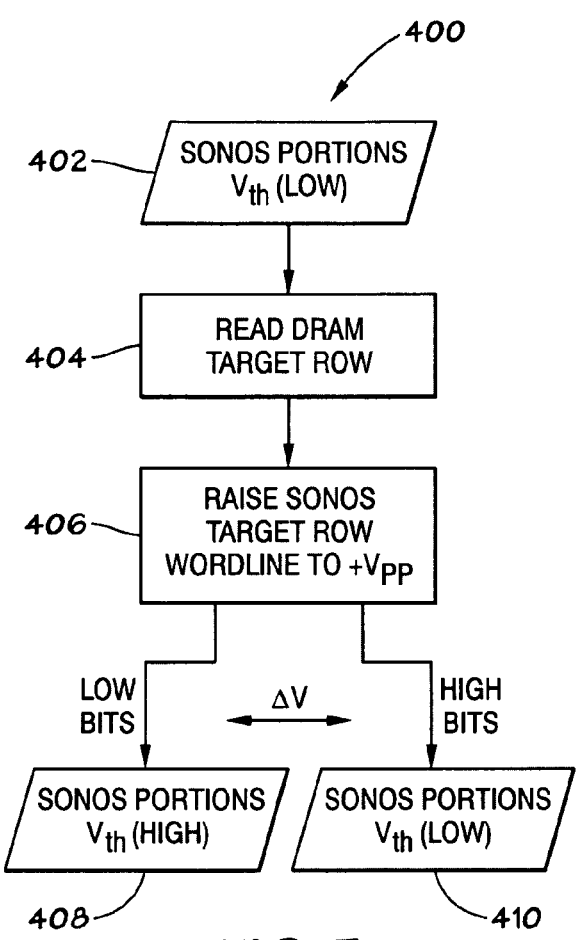
FIG. 5 is a flowchart of a transfer operation from volatile memory portions to non-volatile memory portions of the memory cells of the memory array of FIGS. 1-2 in accordance with an embodiment of the present invention.

FIG. 5 depicts a process 400 for transferring data from the volatile memory portions, e.g., DRAM "cells" of the memory cells, of the memory array. Initially, the non-volatile memory portions should be erased, as described above in FIG. 4. If the non-volatile memory portions have been erased, then no charge (electrons) is trapped in the insulator, e.g. silicon nitride, of the non-volatile memory portions, thus resulting in a low threshold voltage ($V_{th}$(low)) (block 402). The data in the volatile memory portions to be transferred is read from the target row (block 404), such as by raising the volatile memory wordline to $V_{CCP}$ and strobing the sense amplifiers coupled to the bitlines for those memory cells. Alternatively, in one embodiment the bitlines may be disconnected from the sense amplifiers via ISO devices, and the high bitlines raised from $V_{CC}$ to $V_{CCP}$.

To transfer the data to the non-volatile memory portions, the non-volatile memory wordline for the target row is raised to $+V_{PP}$ (block 406). The voltage difference between the low bitlines and the wordline of the target row will be large enough to induce current to flow across the transistor and pull charge (electrons) into the insulator. Thus, charge (electrons) may be trapped in the insulator, e.g. silicon nitride, of the non-volatile memory portions for those memory cells coupled to the low bitlines. As charge is now trapped in these non-volatile memory portions, the threshold voltage of these cells is increased to $V_{th}$(high). To ensure that those non-volatile memory portions of those memory cells coupled to the high bitlines do not also trap charge during this operation, the difference in voltage ($\Delta V$) between the high and low bitlines should be sufficiently high to prevent the threshold voltage of the non-volatile memory portions of the memory cells coupled to the high bitlines from changing. In one embodiment, this may be accomplished by raising the high bitlines to $V_{CCP}$. At the completion of the transfer operation, the non-volatile memory portions coupled to the low bitlines now have a high threshold voltage (block 408), i.e., those cells have charge (electrons) trapped in the insulator layer. Similarly, those non-volatile memory portions for the high bitlines retain a low threshold voltage (block 410), as no charge (electrons) is trapped in the insulator layer.

Figure 6:
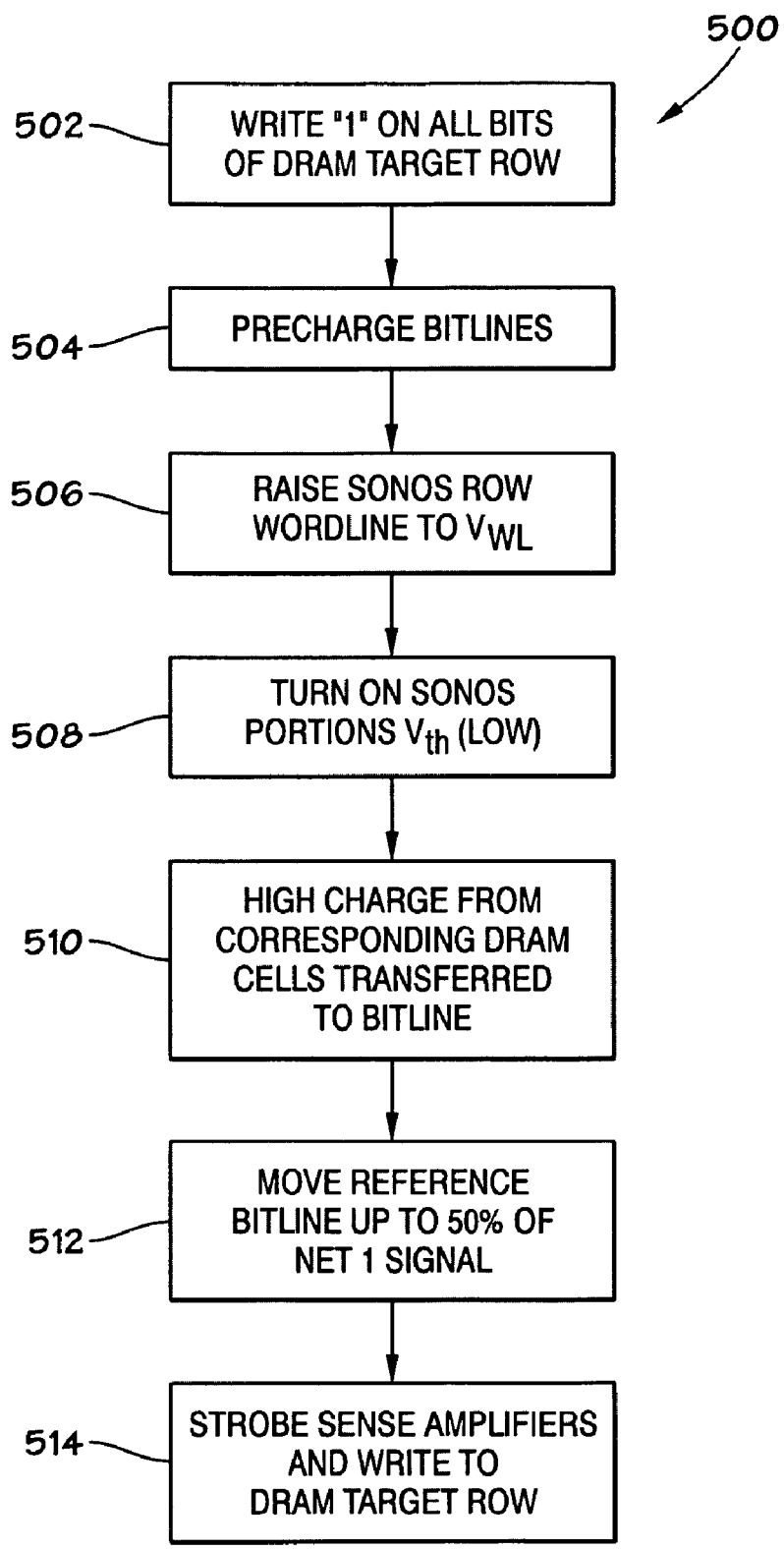
FIG. 6 is a flowchart of a transfer operation from non-volatile memory portions to volatile memory portions of the memory cells of the memory array of FIGS. 1-2.

As mentioned above, another transfer operation that may be performed on the memory array is a transfer of data from the non-volatile memory portions, e.g. SONOS "cells" of the memory cells, to the volatile memory portions, e.g. DRAM "cells" of the memory cells. Such a transfer may occur for example, after data has been stored in the non-volatile memory portions and power to the memory array is restored. FIG. 6 depicts a process 500 of a transfer operation from a row of nonvolatile memory portions to a row of volatile memory portions. Initially, the volatile memory word line is raised to $V_{CCP}$ (block 502). Next, the bitlines are precharged (block 504), e.g. a standard DRAM precharge operation, by applying an intermediate voltage DVC2 ($\sim V_{CC}/2$).

After the precharge operation, the wordline of the non-volatile memory portions of the memory cells of the target row is raised to a regulated voltage ($V_{WL,SONOS}$) (block 506). In one embodiment, this voltage may be approximately $((DVC2)+(V_{th}(high)+V_{th}(low))/2)$. At this voltage, only those non-volatile memory portions having a low threshold voltage ($V_{th}(low)$) will allow current to flow and the corresponding transistor to turn on (block 508). As discussed above with regard to the transfer operation from volatile memory to non-volatile memory, those cells that have a low threshold voltage are the non-volatile memory portions of the memory cells coupled to the high bitlines during the transfer to the non-volatile memory portions. As the transistors of the non-volatile memory portions having a low threshold are turned on, the high charge from the volatile memory portions of those memory cells coupled to those transistors will be transferred to the bitlines (510). The reference bitlines (on the other side of the sense amplifiers) are raised up to a set target value (block 512), and by strobing the sense amplifiers, e.g., data is written to the volatile memory portions of the memory cells of the target row (block 514). In one embodiment, the set target value may be 50% of the high signal.

Figure 7A:
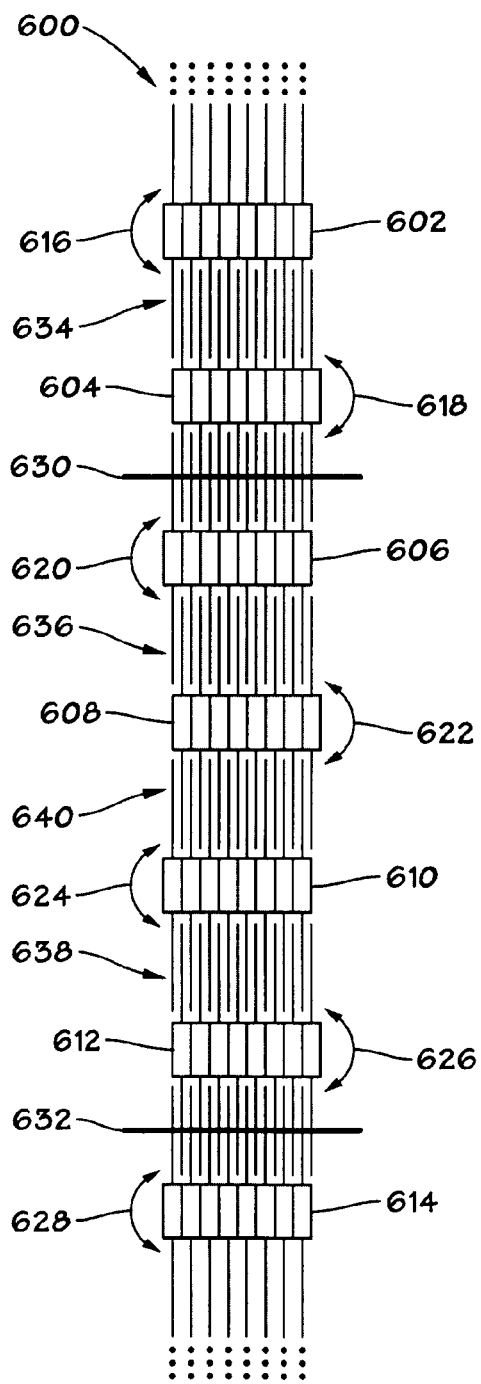
FIG. 7 is a schematic diagram of a bulk operation in accordance with an embodiment of the present operation.
Figure 7B:
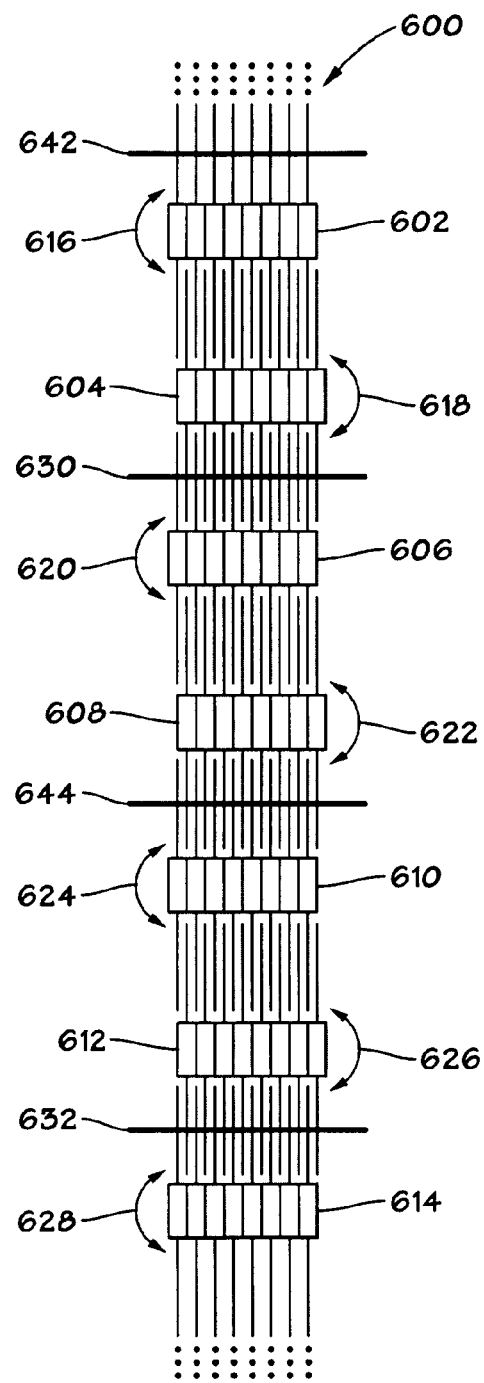

As discussed above, various operations performed on the memory array, such as erasing the non-volatile memory portions of the memory cells, transferring data from the non-volatile memory portions to the volatile memory portions, and transferring data from the volatile memory portions to the non-volatile memory portions, may be performed across multiple rows or sense amplifier sections simultaneously. Such a "bulk" operation provides for faster completion of the erase, transfer, or other operation, as opposed to a row by row operation. The "bulk" operation can be iterated over these groups of target rows, and may only be limited by the power provided to the memory array, the capacity of the charge pumps, and bussing integrity. FIGS. 7A and 7B depict a simplified illustration of such a "bulk" operation in accordance with an embodiment of the present invention.

FIGS. 7A and 7B, the memory array 600 includes depict a memory array 600, such as a memory array constructed via the high aspect ratio structure described above in FIG. 1. As illustrated in FIGS. 7A and 7B the memory array 600 includes seven rows of sense amplifiers 602, 604, 606, 608, 610, 612, and 614. Each row of sense amplifiers are coupled to multiple bitlines 616, 618, 620, 622, 624, 626, and 628. In the embodiment depicted in FIGS. 7A and 7B, the bitlines are arranged in an open bitline configuration, as each group of sense amplifiers with one set of bitlines "up" and another set of bitlines "down." As discussed above, each sense amplifier section also includes a wordline coupled to the non-volatile memory portions of a row of memory cells, and a wordline coupled to the volatile memory portions of a row of memory cells, such as in the memory array structure depicted above in FIGS. 1 and 2. However, to better illustrate the bulk operation, only the active rows are depicted in FIGS. 7A and 7B.

By activating some of the sense amplifiers, and leaving other sense amplifiers inactive, multiple rows may be activated without interfering with each other. For example, FIG. 7A depicts an operation in which two rows 630 and 632 are activated simultaneously. To activate those memory cells in row 630, sense amplifiers 604 and 606 are activated such that 100% of the bitlines coupled to row 630 move. Similarly, to activate row 632, sense amplifiers 626 and 628 are activated, thus moving 100% of the bitlines coupled to row 632. However, sense amplifiers 602, 608 and 610 are inactive. Thus, only 50% of bitlines in the section 634 move, 50% of bitlines in section 636 move, and 50% of the bitlines in section 638 move. Further, to fully isolate the active rows, 0% of bitlines in section 640 are active, as those bitlines are coupled to inactive sense amplifiers 608 and 610. The inactive bitlines are kept precharged in preparation for the next iteration.

Turning now to FIG. 7B, the second iteration of the operation being performed on the memory array 600 is depicted by highlighted active rows 642 and 644. The sense amplifiers 602, 608, and 610 corresponding to those bitlines coupled to the active rows are active. Additionally, sense amplifiers 604, 606, and 612 and 614 retain data from the first iteration, and previously activated rows 630 and 632 remain high. By activating rows 642 and 644, those memory cells coupled to bitlines 616, 622, and 624 will be accessed. In this manner, rows 630 and 632 may be activated at the same time in a first iteration, and rows 642 and 644 activated in a second iteration. In some embodiments, a charge pump other high voltage device may control the duration between each cycle or iteration. For example, a charge pump may build charge between each cycle or iteration so that the sufficient voltage may be supplied to the active rows. This type of operation may be performed across all sections of the memory array 600 by using the active and inactive sense amplifier schema described. Advantageously, the simultaneous activation of multiple rows reduces the amount of time necessary to perform the operation across the entire memory array.

Turning to the figures, FIG. 8 depicts a processor-based system, generally designated by reference numeral 700. As is explained below, the system 700 may include various electronic devices manufactured in accordance with embodiments of the present technique. The system 700 may be any of a variety of types such as a computer, pager, cellular phone, personal organizer, control circuit, etc. In a typical processor-based system, one or more processors 712, such as a microprocessor, control the processing of system functions and requests in the system 700. The processor 712 and other subcomponents of the system 700 may include structures manufactured in accordance with embodiments of the present technique, as is subsequently explained.

The system 700 typically includes a power supply 714. For instance, if the system 10 is a portable system, the power supply 714 may advantageously include a fuel cell, permanent batteries, replaceable batteries, and/or rechargeable batteries. The power supply 714 may also include an AC adapter, so the system 700 may be plugged into a wall outlet, for instance. The power supply 714 may also include a DC adapter such that the system 700 may be plugged into a vehicle cigarette lighter, for instance.

Various other devices may be coupled to the processor 712 depending on the functions that the system 700 performs. For instance, a user interface 716 may be coupled to the processor 712. The user interface 716 may include buttons, switches, a keyboard, a light pen, a mouse, a digitizer and stylus, and/or a voice recognition system, for instance. A display 718 may also be coupled to the processor 712. The display 718 may include an LCD, a CRT display, a DLP display, a plasma display, an OLED display, LEDs, and/or an audio display, for example. Furthermore, an RF sub-system/baseband processor 720 may also be coupled to the processor 712. The RF sub-system/baseband processor 720 may include an antenna that is coupled to an RF receiver and to an RF transmitter (not shown). One or more communication ports 722 may also be coupled to the processor 712. The communication port 722 may be adapted to be coupled to one or more peripheral devices 724 such as a modem, a printer, a computer, or to a network, such as a local area network, remote area network, intranet, or the Internet, for instance.

The processor 712 generally controls the system 700 by implementing software programs stored in the memory. The memory is operably coupled to the processor 712 to store and facilitate execution of various programs. For instance, the processor 712 may be coupled to a memory 726. The memory 726 may include a memory array manufactured and operated according to the embodiments of the invention discussed above, such that the memory 726 may include a memory array having memory cells that include volatile memory and non-volatile memory portions. Thus, the system 700 may use a single memory 726 to provide both the non-volatile and volatile memory storage. As described, during operation of the volatile memory portions of the memory 726, the memory 726 may operate as DRAM. Similarly, during operation of the non-volatile memory portions of the memory 726, the memory 726 may operate as charge trap memory, such as flash memory, SONOS memory, or any other suitable non-volatile memory.

In addition to the memory 726, the system 700 may include separate volatile memory devices, such as DRAM, SRAM. The system 700 may also include separate non-volatile memory devices, such as an EPROM, flash memory, SONOS memory, etc., and magnetic storage devices such as hard disk drives, tape drives, etc.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A device comprising:
a fin field-effect transistor (finFET) memory array comprising:
a memory cell comprising:
a volatile memory portion; and
a non-volatile memory portion,
wherein the volatile memory portion and the non-volatile memory portion share a source, a drain, and a body of a fin field-effect transistor.

2. The device of claim 1, comprising a dataline coupled to the source of the transistor.

3. A method of operating a memory array, comprising:
reading data from one of a volatile memory portion of a memory cell or a non-volatile portion of a memory cell; and
writing the data to the other portion of the memory cell, wherein the volatile memory portion and non-volatile memory portion of the memory cell share a source, a drain, and a body of a fin-field effect transistor (finFET).

4. The method of claim 3, wherein reading data from a row of the volatile memory portions comprises applying a voltage to a gate coupled to the volatile memory portions of the memory cell.

5. The method of claim 3, comprising erasing the non-volatile memory portion of the memory cell prior to writing the data to the non-volatile memory portion of the memory cell.

6. The method of claim 5, wherein the erasing is initiated by a signal indicating a change in a system using the memory array.

7. The method of claim 3, wherein writing the data comprises applying a voltage to a gate coupled to the non-volatile memory portion of the memory cell.

8. The method of claim 7, comprising applying the voltage to a second gate coupled to a non-volatile memory portion of a second memory cell such that charge is trapped in the non-volatile memory portion of the memory cell but not the non-volatile memory portion of the second memory cell.

9. The method of claim 3, wherein reading data from the non-volatile memory portion of the memory cell comprises applying a voltage to a gate coupled to the non-volatile memory portion of the memory cell.

10. The method of claim 3, wherein reading data from the non-volatile memory portion of the memory cell comprises using a DRAM capacitor to read a flash memory cell.

11. The method of claim 9, wherein the voltage activates the non-volatile memory portion of the memory cell if the non-volatile memory portion comprises a low threshold voltage.

12. The method of claim 3, wherein reading comprises precharging one or more datalines of the memory array.

13. A method of operating a memory array, comprising:
reading data from volatile memory portions of a first row of memory cells;
writing the data to volatile memory portions of a second row of memory cells;
erasing non-volatile memory portions of the first row of memory cells;
reading data from the volatile memory portions of the second row of memory cells; and
writing the data to the volatile memory portions of the first row of memory cells.

14. The method of claim 13, wherein erasing the non-volatile memory portions of the first row of memory cells comprises lowering a voltage applied to gate coupled to the non-volatile memory portions of the first row of memory cells.

15. The method of claim 14, wherein erasing comprises activating at least one of a plurality of datalines of the memory array.

16. A method of operating a memory array, comprising:
transferring data from non-volatile memory portions of a row of memory cells to volatile memory portions of the row of memory cells;
erasing the non-volatile memory portions of the row of memory cells; and
transferring data from the volatile memory portions of the row of memory cells to the non-volatile memory portions of the row of memory cells,
wherein the non-volatile memory portion and the volatile memory portion of each memory cell share a source, a drain, and a body of a fin field-effect transistor.

17. The method of claim 16, wherein the non-volatile memory portions comprise charge storage node.

18. The method of claim 16, wherein the non-volatile memory portions comprise SONOS memory.

19. The method of claim 16, wherein the volatile memory portions comprises a capacitive element.

20. A method of operating a memory array, comprising:
activating a first plurality of rows of the memory array, wherein each of the rows are electrically isolated from each other, wherein an active row of the first plurality of rows does not interfere with another active row of the first plurality of rows, wherein the memory array comprises memory cells having non-volatile memory portions and volatile memory portions, wherein the non-volatile memory portion and the volatile memory portion of each memory cell share a source, a drain, and a body.

21. The method of claim 20, comprising electrically isolating the first plurality of rows via a sense module.

22. The method of claim 20, comprising activating a plurality of sense amplifiers such that at least 50% of a plurality of datalines coupled to the plurality of sense amplifiers and the first plurality of rows are active.

23. The method of claim 20, comprising activating a second plurality of rows of the memory array, wherein each of the rows are electrically isolated from each other, such that an active row of the second plurality of rows does not interfere with another active row of the second plurality of rows and the first plurality of rows.

24. The device of claim 1, wherein the non-volatile memory portion comprises SONOS memory.

* * * * *